United States Patent
Liu et al.

(10) Patent No.: US 6,218,276 B1
(45) Date of Patent: *Apr. 17, 2001

(54) SILICIDE ENCAPSULATION OF POLYSILICON GATE AND INTERCONNECT

(75) Inventors: Yauh-Ching Liu, Sunnyvale; Gary K. Giust, Cupertino; Ruggero Castagnetti, San Jose; Subramanian Ramesh, Cupertino, all of CA (US)

(73) Assignee: LSI Logic Corporation, Milpitas, CA (US)

(*) Notice: Subject to any disclaimer, the term of this patent is extended or adjusted under 35 U.S.C. 154(b) by 0 days.

This patent is subject to a terminal disclaimer.

(21) Appl. No.: 08/995,875

(22) Filed: Dec. 22, 1997

(51) Int. Cl.[7] .................. H01L 21/3205; H01L 21/4763; H01L 21/41; H01L 21/8238
(52) U.S. Cl. .......................... 438/596; 438/199; 438/299; 438/303; 438/592; 438/595; 438/655; 438/656; 438/664
(58) Field of Search .................. 438/299, 592, 438/596, 595, 648, 649, 651, 682, 197, 199, 303, 647, 652, 655, 656, 657, 658, 664

(56) References Cited

U.S. PATENT DOCUMENTS

| | | | |
|---|---|---|---|
| 4,263,058 | 4/1981 | Brown et al. ............................ 148/6 |
| 4,716,131 | * 12/1987 | Okazawa et al. ..................... 437/200 |
| 4,868,617 | 9/1989 | Chiao et al. ......................... 357/23.3 |
| 5,091,763 | 2/1992 | Sanchez .............................. 357/23.9 |
| 5,132,756 | 7/1992 | Matsuda .............................. 357/23.1 |
| 5,162,884 | 11/1992 | Liou et al. ............................ 257/384 |
| 5,183,771 | 2/1993 | Mitsui et al. .......................... 437/44 |
| 5,227,320 | 7/1993 | Johnson et al. ........................ 437/44 |
| 5,231,042 | 7/1993 | Ilderem et al. ......................... 437/44 |
| 5,256,585 | 10/1993 | Bae ...................................... 437/44 |
| 5,290,720 | 3/1994 | Chen .................................... 437/41 |
| 5,306,951 | 4/1994 | Lee et al. ............................... 257/755 |
| 5,341,028 | 8/1994 | Yamaguchi et al. .................. 257/344 |
| 5,397,722 | 3/1995 | Bashir et al. .......................... 437/41 |
| 5,397,909 | 3/1995 | Moslehi ................................ 257/383 |
| 5,444,024 | 8/1995 | Anjum et al. ......................... 437/200 |
| 5,473,184 | 12/1995 | Murai ................................... 257/383 |
| 5,510,648 | 4/1996 | Davies et al. ......................... 257/657 |
| 5,565,383 | 10/1996 | Sakai .................................... 437/200 |
| 5,580,806 | 12/1996 | Chang et al. .......................... 437/44 |
| 5,658,807 | 8/1997 | Manning .............................. 438/158 |
| 5,658,815 | 8/1997 | Lee et al. .............................. 438/304 |
| 5,723,893 | 3/1998 | Yu et al. ............................... 257/413 |
| 5,739,573 | 4/1998 | Kawaguchi ........................... 257/384 |
| 5,869,377 | 2/1999 | Watabe et al. ........................ 438/305 |

OTHER PUBLICATIONS

Yauh–Ching Liu, Gary K. Giust, Ruggero Castagnetti, and Subramanian Ramesh, "Metal–Encapsulated Polysilicon Gate and Interconnect", Application Serial No: 09/069,027, Filing Date Apr. 27, 1998, Claims from corresponding U.S. Patent application (LSI1P141).

Wolf, et al., "Silicon Processing for the VLSI ERA", *Processing Technology*, vol. 1, pp. 397–399 (1985).

\* cited by examiner

*Primary Examiner*—Charles Bowers
*Assistant Examiner*—Thanhha Pham
(74) *Attorney, Agent, or Firm*—Beyer Weaver & Thomas

(57) ABSTRACT

Provided is a method of forming a silicide layer on the top and sidewall surfaces of a polysilicon gate/interconnect in a MOS transistor and on the exposed surfaces of the source and drain regions of the transistor. Devices produced according to the present invention may have different types of silicide formed on their gate and their source/drain electrodes. The invention achieves the advantages of silicide encapsulation of a polysilicon gate in an MOS transistor while also providing silicidation of the source/drain regions of the transistor, thereby reducing electrode resistivity in the transistor and interconnect.

26 Claims, 2 Drawing Sheets

SILICIDE ENCAPSULATION OF POLYSILICON GATE AND INTERCONNECT

CROSS-REFERENCE TO RELATED APPLICATIONS

This application is related to concurrently-filed U.S. application Ser. No. 08/995,874 which is incorporated by reference herein for all purposes.

BACKGROUND OF THE INVENTION

The present invention relates to the use of silicidation to reduce device resistance and signal propagation delays in semiconductor devices. More particularly, the present invention relates to silicide encapsulation of MOS transistor gates and interconnects.

Silicides, such as tungsten silicide ($WSi_2$), titanium silicide ($TiSi_2$), and cobalt silicide ($CoSi_2$) are used in the semiconductor industry to enhance signal propagation through MOS transistors and other conductive features of semiconductor devices. A conventional silicide process produces a silicide region on the top of an MOS transistor's polysilicon ("poly") gate electrode and interconnect. The silicide has a lower resistance than the underlying doped silicon or poly. As a result, signal propagation through the transistor (gate and interconnect) is enhanced.

FIGS. 1A through 1E illustrate a conventional silicide process on a portion of a semiconductor wafer, such as is also described in S. Wolf, et al., *Silicon Processing for the VLSI Era*, vol.1, 397–399 (Lattice Press, 1986), which is incorporated by reference herein for all purposes. In FIG. 1A, a portion of a semiconductor wafer 100 having a semiconductor substrate 101 (typically monocrystalline silicon) is shown. The substrate 101 has gate oxide 102 and poly 104 layers generated successively on its upper surface 106. The gate oxide 102 and poly 104 layers are created in ways well known to those of skill in the art. For example, the gate oxide may be silicon dioxide ($SiO_2$) generated by thermal oxidation of surface 106 of the silicon substrate 101, and the poly 104 may be deposited on the gate oxide 102 by chemical vapor deposition. FIG. 1B shows the wafer 100 after the poly layer 104 has been patterned and etched to form a gate electrode 108 according to methods well known in the art (e.g., photolithography and plasma etching).

At this point, an ion implantation may be performed to form at least a portion of the source and drain regions. This implant is sometimes referred to as a lightly doped drain (LDD) implant and is self-aligned with polysilicon gate electrode 108.

Next, as shown in FIG. 1C, a layer of dielectric 110 is deposited on the wafer surface, covering both the gate oxide 102 and the gate electrode 108. The wafer is then subjected to an anisotropic etch which removes the dielectric 110 and gate oxide 102 on all exposed horizontal surfaces. The remaining dielectric 110 provides vertical spacers 112. It should be noted that the terms "horizontal" and "vertical" are used herein relatively and with reference to a major surface of a semiconductor wafer, and may be interchanged. The spacers 112 act as an ion implantation mask for subsequent ion implant procedures which are used to dope portions of the substrate 101 adjacent to the gate electrode 108 in order to create or complete (depending on whether an LDD implant was performed) source 114 and drain 116 regions, as shown in FIG. 1D. The spacers 112, together with the remaining gate oxide 102, separate the poly gate 108 from the source 114 and drain 116 regions. As shown in FIG. 1E, after ion implantation, a refractory metal, such as titanium (Ti) is deposited on the wafer surface, and silicide layers 120, 122 and 124 are formed on the poly gate 108, source 114, and drain 116 regions, respectively, by reaction with the underlying poly/silicon by an alloy step well known in the art. Then, unreacted Ti is removed by a selective wet etch process, also well known in the art.

The conventional process of FIGS. 1A–1E results in the formation of silicide on the top surface but not the sidewalls of gate electrode. This is because sidewall spacers 112 protect the gate electrode sidewalls during silicide formation. This has the benefit of preventing the silicide layer from shorting the gate electrode to the source and drain regions. However, it has the disadvantage of providing only limited reductions in resistance. Until now, most processes did not require additional reductions in resistance. However, deep sub-micron device sizes require more significant reductions in resistance.

In order to achieve further reductions in resistance, it has been proposed that the silicide layer extend down the sidewalls of the gate electrode. U.S. Pat. Nos. 5,227,320 and 5,306,951 present examples of such silicide "encapsulated" gate electrodes. To prevent shorting between the sidewall silicide and the source drain region, these designs allow the gate oxide to extend over the source and drain regions. Unfortunately, this precludes silicide formation on the source and drain regions.

As semiconductor device feature size is scaled below 0.25 $\mu$m, interconnect and gate delays becomes increasingly important.

Accordingly, processes and apparatuses for further reducing device resistance and signal propagation delays are needed.

SUMMARY OF THE INVENTION

To achieve the foregoing, the present invention provides methods of forming a silicide layer on the exposed horizontal and vertical surfaces of a polysilicon gate electrode/interconnect in a MOS transistor. The silicide-encapsulation method of the present invention also results in silicidation of the exposed surfaces of the source and drain regions of the transistor with silicide. Devices produced according to the present invention may have different types of silicide formed on various gate and source/drain electrode surfaces. For example, devices produced according to the present invention may have different types of silicide formed on their gate and their source/drain electrodes.

The invention provides a method of fabricating a semiconductor device. The method includes providing a partially-formed electronic device including a semiconductor substrate having a gate dielectric and gate electrode formed thereon, and doped source and drain active regions on either side of the gate electrode. A silicide layer is formed on a top surface and sidewalls of the gate electrode and on the source and drain active regions, and spacer dielectric regions are formed between portions of the silicide layer on the gate electrode and the doped source and drain active regions, so that the gate electrode is isolated from the source and drain active regions.

In addition, the invention provides procedures for implementing the methods of fabricating a semiconductor devices which provide flexibility in the selection and placement of silicide materials.

Further, the invention provides a semiconductor device. The device includes a semiconductor substrate having an electrically active surface, a gate dielectric region provided on a portion of the electrically active surface of the substrate, a gate electrode having a top surface and two sidewall surfaces provided on the dielectric region, and doped source and drain active regions separated at the substrate's electrically active surface by a channel region under the gate dielectric region. A silicide layer is provided on the top surface and two sidewall surfaces of the gate electrode, and the doped source and drain active regions. Spacer dielectric regions are positioned between portions of the silicide layer on the gate electrode and the doped source and drain active regions, so that the spacer dielectric regions electrically isolate the gate electrode from the doped source and drain active regions.

These and other features and advantages of the present invention are described below with reference to the drawings.

DETAILED DESCRIPTION OF THE PREFERRED EMBODIMENTS

Reference will now be made in detail to preferred embodiments of the invention. Examples of the preferred embodiments are illustrated in the accompanying drawings. While the invention will be described in conjunction with these preferred embodiments, it will be understood that it is not intended to limit the invention to such preferred embodiments. On the contrary, it is intended to cover alternatives, modifications, and equivalents as may be included within the spirit and scope of the invention as defined by the appended claims. In the following description, numerous specific details are set forth in order to provide a thorough understanding of the present invention. The present invention may be practiced without some or all of these specific details. In other instances, well known process operations have not been described in detail in order not to unnecessarily obscure the present invention.

The present invention provides methods of forming a silicide layer on the exposed horizontal and vertical surfaces of a polysilicon gate electrode/interconnect in a MOS transistor. The silicide-encapsulation method of the present invention also results in silicidation of the exposed surfaces of the source and drain regions of the transistor with silicide. Devices produced according to the present invention may have different types of silicide formed on various gate and source/drain electrode surfaces. For example, devices produced according to the present invention may have different types of silicide formed on their gate and their source/drain electrodes.

Figure 2A:
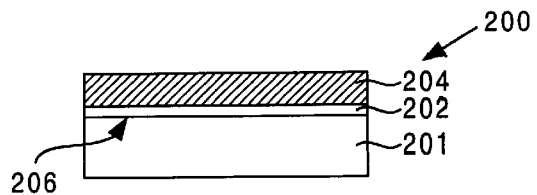
FIGS. 2A–G depict cross-sectional views of a portion of a semiconductor wafer showing various stages in a silicide process according to a preferred embodiment of the present invention.

FIGS. 2A through 2G illustrate steps in the fabrication of a silicide encapsulated MOS transistor according to a preferred embodiment of the present invention. In FIG. 2A, a portion of a semiconductor wafer 200 having a semiconductor substrate 201 (typically monocrystalline silicon) is shown. The substrate 201 has gate dielectric 202 and gate electrode 204 layers generated on its upper surface 206. The gate dielectric 202 and gate electrode 204 layers may be generated in ways well known to those of skill in the art. For example, the gate dielectric 202 may be silicon dioxide ($SiO_2$) grown by thermal oxidation of surface 206 of the silicon substrate 201 or deposited on the surface 206 by chemical vapor deposition (CVD). The gate electrode 204 may be polysilicon, for example, doped with n-type or p-type dopant atoms at about $10^{20}$ to $10^{21}$ cm$^{-3}$ deposited on the oxide to a thickness of about 1000 and 3000 Å by, for example, CVD.

Figure 2B:
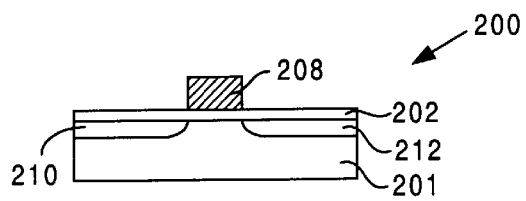

FIG. 2B shows the wafer 200 after the poly gate electrode layer 204 has been patterned and etched to form a polysilicon gate 208 according to methods well known in the art. The gate length is dependent upon the current process technology. As their invention finds special application in deep sub-micron technologies, the length of gate electrode 208 is preferably no more than about 0.5 microns, more preferably no more than about 0.25 microns, and most preferably less than about 0.2 microns.

Ion implant procedures may be used to dope portions of the substrate 201 adjacent to the gate 208 in order to create source 210 and drain 212 regions. For example, the substrate 201 may be n- or p-doped at a concentration of about $10^{20}$ to $10^{21}$ cm$^{-3}$ to a depth of about 0.05 to 0.2 micrometers below the substrate 201 surface. The source 210 and drain 212 regions may be complete as formed by this implant or may be completed by another ion implant step at a subsequent stage of the fabrication according to procedures well known in the art. For example, a second source/drain implant step may be performed between the stages illustrated in FIGS. 2F and 2G wherein the spacers 218, in addition to the gate 208, may act as an ion implantation mask. It should be noted that the terms "source" and "drain" are used in a relative sense and may be interchanged.

Figure 2C:
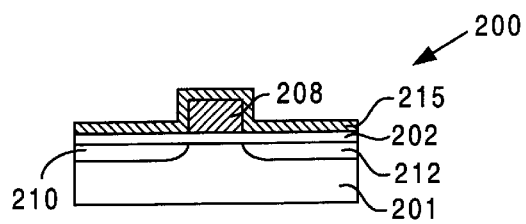

Next, as shown in FIG. 2C, a layer of a suitable refractory metal is formed on the exposed surfaces of the gate 208 (that is, all surfaces except the gate electrode 208/gate dielectric 202 interface). The thickness of the metal layer may be preferably about 200 to 1500 Å, more preferably about 400 to 800 Å, and most preferably about 600 Å. Suitable refractory metals are those which, when deposited on a silicon surface, may be converted to a stable silicide by thermal treatment at standard processing temperatures. For example, cobalt, titanium, tantalum, molybdenum, or nickel may be used. The deposited metal layer is then converted to its corresponding silicide by conventional thermal processing performed by heating in a rapid thermal anneal step. For example, a rapid thermal anneal may be performed by heating the substrate 201 to about 400 to 950° C. for a period of about 10 to 60 seconds. Alternatively, furnace annealing may be used. The thickness of the resulting silicide layer 215 is dependent upon the type of metal used, and may be about 1 to 2 times the thickness of the originally deposited metal layer.

Alternatively, an encapsulating silicide layer 215 is formed on the exposed surfaces of the gate 208 (that is, all surfaces except the gate electrode 208/gate dielectric 202 interface). The thickness of the silicide layer 215 may be preferably about 200 to 1500 Å, more preferably about 400 to 800 Å, and most preferably about 600 Å. A variety of silicides may be used, for example, those based on the refractory metals, particularly, cobalt silicide ($CoSi_2$), titanium silicide ($TiSi_2$), tungsten silicide ($WSi_2$), tantalum silicide ($TaSi_2$), molybdenum silicide ($MoSi_2$), and nickel silicide ($NiSi_2$). The silicide layer 215 may be formed according to a preferred embodiment of the present invention referred to as "blanket deposit polycide" in which a blanket layer of silicide is deposited directly on the polysilicon gate electrode 208 and gate dielectric 202, for example, by chemical vapor deposition using process parameters well known to those of skill in the art.

Figure 2D:
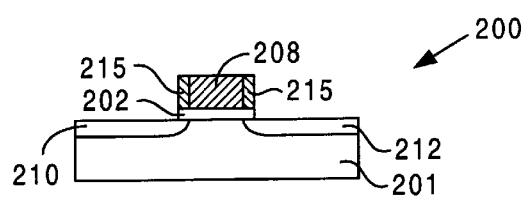

Following the silicidation described above, the silicide and dielectric on all exposed horizontal surfaces is removed, for example, by an anisotropic etch performed under conditions well known in the art. For example, a dry etch employing a high density plasma with chlorine-based chemistry may be employed. FIG. 2D shows the wafer 200 following this anisotropic etch, with the silicide layer 215 remaining only on the vertical sides of the gate electrode 208.

Figure 2E:
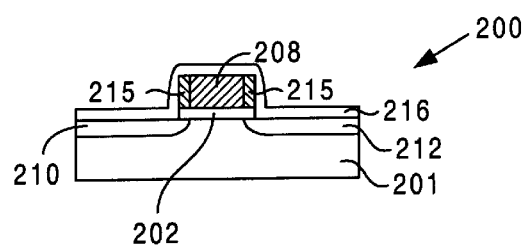

Next, a spacer dielectric layer 216 is conformally deposited over the wafer surface, covering both the gate dielectric 202 and the partially silicide encapsulated gate electrode 208, as shown in FIG. 2E. The spacer dielectric layer 216 is preferably about 500 to 1500 Å thick. The spacer dielectric layer 216 may be deposited in ways well known to those of skill in the art. For example, the spacer dielectric 202 may be deposited by CVD. The spacer dielectric 216 material preferably includes silicon dioxide ($SiO_2$) or silicon nitride ($Si_3N_4$). A preferred material for both the gate dielectric 202 and the spacer dielectric 216 is silicon dioxide.

Figure 1A:
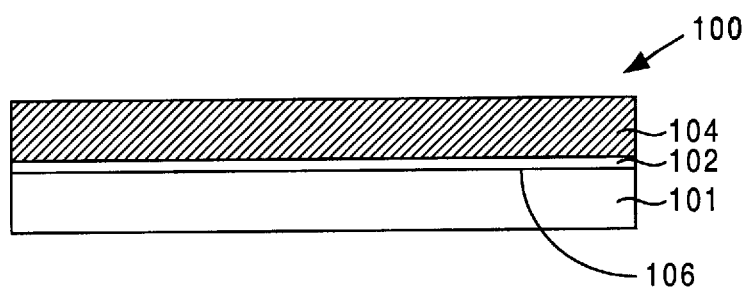
FIGS. 1A–E depict cross-sectional views of a portion of a semiconductor wafer showing various stages in a conventional silicide process.
Figure 1B:
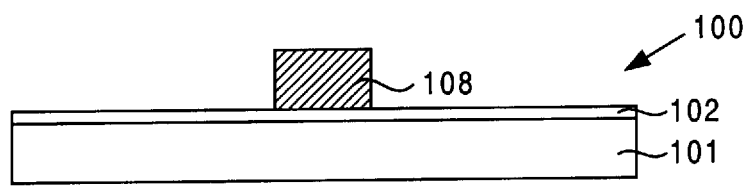
Figure 1C:
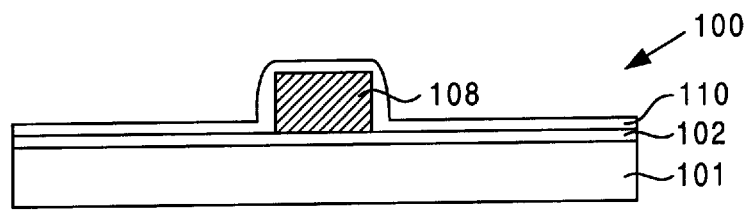
Figure 1D:
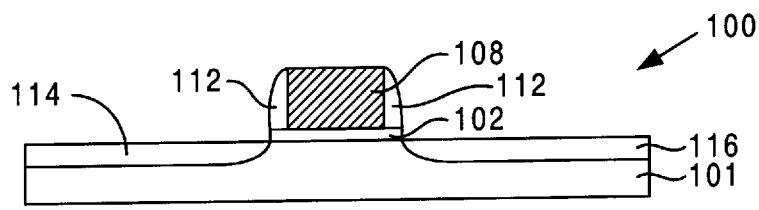
Figure 1E:
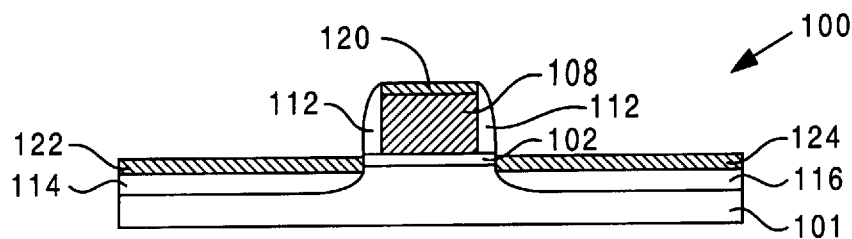
Figure 2F:
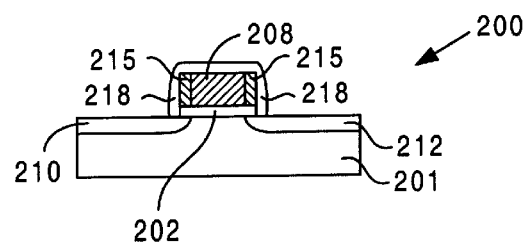

As shown in FIG. 2F, the spacer dielectric 216 on all exposed horizontal surfaces is then removed. This removal may be accomplished, for example, by an anisotropic etch performed under conditions well known in the art, such as described above with reference to FIG. 1D. The remaining spacer dielectric 216 provides vertical spacers 218. The spacers 218, together with the remaining gate oxide 202, separate the silicide encapsulated poly gate electrode 208 from the source 210 and drain 212 regions.

Figure 2G:
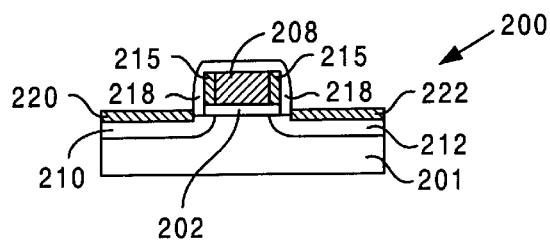

Then, as shown in FIG. 2G, a second silicidation is performed over the top of the gate electrode 208 and the source 210 and drain 212 regions of the wafer 200. This second silicidation may be conducted using any process which provides a silicide on the top surface of the gate electrode 208 and the source 210 and drain 212 regions, but not on the spacers 218. For example, a refractory metal layer may be deposited over the surface of the partially-formed device, including the exposed polysilicon of the gate 208 and the silicon of the source 210 and drain 212 regions, for example, by CVD or sputtering. The metal layer may be about 200 to 1500 Å thick. Then, a rapid thermal anneal step may be performed to react the underlying polysilicon of the gate electrode 208 and the silicon of the source 210 and drain 212 regions with the deposited metal to form the encapsulating silicide layers 224, and 220 and 222, respectively.

For example, a rapid thermal anneal may be performed by heating the substrate 201 to about 400 to 950° C. for a period of about 10 to 60 seconds. Alternatively, furnace annealing may be used. The thickness of the resulting silicide layers 224, 220 and 222 is dependent upon the type of metal used, and may be about 1 to 2 times the thickness of the originally deposited metal layer.

The metal deposited on the spacer dielectric 218 does not react to form a silicide and may be removed, for example, by a selective etch which removes unreacted metal but not silicide. For example, unreacted metal may be removed from the spacer dielectric 218 using a mixture of $NH_4OH$, $H_2O_2$ and $H_2O$ or other well-known selective metal etch.

It should be noted that the two-stage silicidation process of the present invention provides the ability to apply silicide to all three electrodes of a MOS transistor. As a result, resistivity in the transistor is decreased and propagation speeds are increased over previous designs. The method further provides the flexibility of being able to form different silicide layers on the same or different electrodes of a transistor. According to preferred embodiments of the invention, a first kind of silicide, for example, $WSi_2$, may be formed on the sides of the gate/interconnect of the transistor and a second kind, for example, $TiSi_2$, on the top of the gate/interconnect and the source and drain electrodes. Since different silicides have somewhat different properties, including resistivity and thermal stability, this flexibility allows a semiconductor device designer to more precisely define the performance of a device by selection and placement of silicides.

Although the foregoing invention has been described in some detail for purposes of clarity of understanding, it will be apparent that certain changes and modifications may be practiced within the scope of the appended claims. Accordingly, the present embodiments are to be considered as illustrative and not restrictive, and the invention is not to be limited to the details given herein, but may be modified within the scope and equivalents of the appended claims.

What is claimed is:

1. A method of fabricating a semiconductor device, comprising:

providing a partially-formed semiconductor device including a silicon semiconductor substrate having a gate dielectric and polysilicon gate electrode formed thereon, and doped source and drain active regions on either side of said gate electrode;

depositing a first refractory metal layer on said partially-formed semiconductor device;

annealing the first refractory metal layer to form a layer of first silicide where the first refractory metal layer contacts silicon or polysilicon on said partially-formed semiconductor device;

removing unreacted portions of the first refractory metal layer, first silicide and gate dielectric formed on horizontal surfaces of said substrate and gate electrode, other than at the gate electrode/substrate interface, so that first silicide remains on the vertical sidewall surfaces of said gate electrode;

forming a layer of spacer dielectric over said gate electrode, first silicide, and substrate;

removing spacer dielectric deposited on horizontal surfaces of the gate electrode, first silicide, and substrate so that vertical dielectric spacers remain on the vertical sidewall surfaces of said gate electrode; and forming a second silicide layer on the top surface of said gate electrode and on said source and drain regions, such that said gate electrode is isolated from said source and drain active regions.

2. The method of claim 1, wherein said gate dielectric comprises silicon dioxide.

3. The method of claim 1, wherein said first refractory metal layer includes at least one of cobalt, titanium, molybdenum, tantalum, and nickel.

4. The method of claim 3, wherein said first refractory metal layer is titanium.

5. The method of claim 1, wherein said first refractory metal layer deposition is done by chemical vapor deposition.

6. The method of claim 1, wherein said removing unreacted portions of the first refractory metal layer is done by anisotropic etching.

7. The method of claim 1, wherein said second silicide layer is formed by a plurality of steps including:

depositing a second refractory metal layer on the top surface of said gate electrode and on said source and drain regions;

annealing said second refractory metal layer to form said second silicide layer where the metal contacts silicon in the source and drain regions and polysilicon in the top surface of said gate electrode; and removing unreacted portions of the second refractory metal layer.

8. The method of claim 7, wherein said second refractory metal layer includes at least one of cobalt, titanium, molybdenum, tantalum, and nickel.

9. The method of claim 8, wherein said second refractory metal layer is cobalt.

10. The method of claim 7, wherein said unreacted portions of the second refractory metal are removed by a selective wet etch.

11. The method of claim 1, wherein said second silicide layer is formed by a plurality of steps including:

masking said partially-formed semiconductor device such that only said the top surface of said gate electrode and said source and drain regions are exposed;

depositing a refractory metal silicide on the top surface of said gate electrode and said source and drain regions;

removing the mask.

12. The method of claim 11, wherein said second silicide layer includes at least one of cobalt silicide, titanium silicide, tungsten silicide, molybdenum silicide, tantalum silicide and nickel silicide.

13. The method of claim 12, wherein said second silicide layer is titanium silicide.

14. A method of fabricating a semiconductor device, comprising:

providing a partially-formed semiconductor device including a silicon semiconductor substrate having a gate dielectric and polysilicon gate electrode formed thereon, and doped source and drain active regions on either side of said gate electrode;

depositing a first refractory metal silicide layer on said partially-formed semiconductor device;

removing first refractory metal silicide and gate dielectric formed on horizontal surfaces of said substrate and gate electrode, other than at the gate electrode/substrate interface, so that first refractory metal silicide remains on the vertical sidewall surfaces of said gate electrode;

forming a layer of spacer dielectric over said gate electrode, first refractory metal silicide, and substrate;

removing spacer dielectric deposited on horizontal surfaces of the gate electrode, first refractory metal silicide, and substrate so that vertical dielectric spacers remain on the vertical sidewall surfaces of said gate electrode;

forming a second refractory metal silicide layer on the top surface of said gate electrode and on said source and drain regions.

15. The method of claim 14, wherein said first and second refractory metal silicide layers include at least one of cobalt silicide, titanium silicide, tungsten silicide, molybdenum silicide, tantalum silicide and nickel silicide.

16. The method of claim 15, wherein said first and second refractory metal silicide layers are tungsten silicide.

17. The method of claim 14, wherein said depositing a first refractory metal silicide layer is done by chemical vapor deposition.

18. The method of claim 14, wherein said removing first refractory metal silicide and gate dielectric formed on horizontal surfaces of said substrate and gate electrode and removing spacer dielectric is done by anisotropic etching.

19. The method of claim 14, wherein said second refractory metal silicide layer is formed by a plurality of steps including:

depositing a second refractory metal layer on the top surface of said gate electrode and said source and drain regions;

annealing said second refractory metal layer to form said second refractory metal silicide layer where said second refractors metal layer contacts polysilicon in the gate electrode and silicon in the source and drain regions; and removing unreacted portions of said second refractory metal layer.

20. The method of claim 19, wherein said second refractory metal layer includes at least one of cobalt, titanium, molybdenum, tantalum, and nickel.

21. The method of claim 20, wherein said second refractory metal layer is cobalt.

22. The method of claim 19, wherein said unreacted portions of said second refractory metal layer are removed by a selective wet etch.

23. The method of claim 1, wherein said first and second refractory metal silicide layers are comprised of portions having different chemical compositions.

24. The method of claim 1, wherein said first and second refractory metal layers are about 200 to 1500 Å thick.

25. The method of claim 1, wherein said semiconductor device further comprises a channel having a length of no more than about 0.5 microns.

26. The method of claim 1, wherein said semiconductor device further comprises a gate having a length of no more than about 0.25 microns.

* * * * *